US007075224B2

(12) United States Patent
Coushaine

(10) Patent No.: US 7,075,224 B2
(45) Date of Patent: Jul. 11, 2006

(54) LIGHT EMITTING DIODE BULB CONNECTOR INCLUDING TENSION RELIEVER

(75) Inventor: Charles M. Coushaine, Rindge, NH (US)

(73) Assignee: OSRAM Sylvania Inc., Danvers, MA (US)

( * ) Notice: Subject to any disclaimer, the term of this patent is extended or adjusted under 35 U.S.C. 154(b) by 331 days.

(21) Appl. No.: 10/830,261

(22) Filed: Apr. 22, 2004

(65) Prior Publication Data

US 2005/0067942 A1 Mar. 31, 2005

Related U.S. Application Data

(60) Provisional application No. 60/507,268, filed on Sep. 30, 2003.

(51) Int. Cl.
*H01L 33/00* (2006.01)
*F21V 19/00* (2006.01)
*F21V 23/00* (2006.01)

(52) U.S. Cl. ........................ 313/498; 313/46; 362/545; 362/294; 362/800

(58) Field of Classification Search ................ 313/498, 313/46, 512; 362/545, 294, 800, 547
See application file for complete search history.

(56) References Cited

U.S. PATENT DOCUMENTS 6,682,211 B1 * 1/2004 English et al. .............. 362/545
6,773,138 B1 * 8/2004 Coushaine .................. 362/656
6,793,374 B1 * 9/2004 Begemann .................. 362/294
6,991,355 B1 * 1/2006 Coushaine et al. ......... 362/555

* cited by examiner

*Primary Examiner*—Karabi Guharay
(74) *Attorney, Agent, or Firm*—William E. Meyer

(57) ABSTRACT

An LED light source (10) comprises a housing (12) having a base (14) with a hollow core (16) projecting therefrom. The core (16) is substantially conical. A central heat conductor (17) is centrally located within the hollow core (16) and is formed from solid copper. A first printed circuit board (18) is connected to one end of the central heat conductor and a second printed circuit board (20) is fitted to a second, opposite end of the central heat conductor (17). The second printed circuit board (20) has at least one LED (24) operatively fixed thereto. A plurality of electrical conductors (26) has proximal ends (28) contacting electrical traces formed on the second printed circuit board (20) and distal ends (30) contacting electrical traces on the first printed circuit board (18). Each of the electrical conductors (26) has a tension reliever (27) formed therein which axially compresses during assembly. A cap (32) is fitted over the second printed circuit board (20); and a heat sink (34) is attached to the base and in thermal contact with the first printed circuit board.

8 Claims, 4 Drawing Sheets

LIGHT EMITTING DIODE BULB CONNECTOR INCLUDING TENSION RELIEVER

CROSS-REFERENCE TO RELATED APPLIATIONS

This application claims priority from Provisional Patent Application No. 60/507,268 filed Sep. 30, 2003.

TECHNICAL FIELD

This application relates to light sources and more particularly to light sources employing light emitting diodes (LED or LEDs). Still more particularly, it relates to light sources useful in the automotive field such as for headlights, taillights, stoplights, fog lights, turn signals, etc.

BACKGROUND ART

In the past, most automotive light sources have involved the use of incandescent bulbs. While working well and being inexpensive, these bulbs have a relatively short life and, of course, the thin filament employed was always subject to breakage due to vibration.

Recently some of the uses, particularly the stoplight, have been replaced by LEDs. These solid-state light sources have incredible life times, in the area of 100,000 hours, and are not as subject to vibration failures. However, these LEDs sources have been hard-wired into their appropriate location, which increase the cost of installation. It would, therefore, be an advance in the art if an LED light source could be provided that had the ease of installability of the incandescent light sources.

DISCLOSURE OF INVENTION

It is, therefore, an object of this invention to enhance replaceable light sources.

It is another object of the invention to provide an LED light source that is convenient to use and simple to install, both for the manufacturer initially and for the ultimate consumer in the unlikely event that replacement is necessary.

These objects are accomplished in one aspect of the invention, by the provision of an LED light source comprising a housing having a base, a hollow core projecting from the base, the core being substantially conical, and a central heat conductor centrally located within the hollow core. A first printed circuit board is connected to one end of the central heat conductor and a second printed circuit board is fitted to a second end of the central heat conductor, the second printed circuit board having at least one LED operatively fixed thereto.

A plurality of electrical conductors having proximal ends is attached to and extends from the second printed circuit board and distal ends attached to the first printed circuit board, each of the electrical conductors having a tension reliever formed therein.

A cap is fitted over the second printed circuit board and a heat sink is attached to the base and in thermal contact with the first printed circuit board.

The tension-relieving feature compresses during assembly and insures good electrical contact between the circuit boards.

BEST MODE FOR CARRYING OUT THE INVENTION

Figure 1:
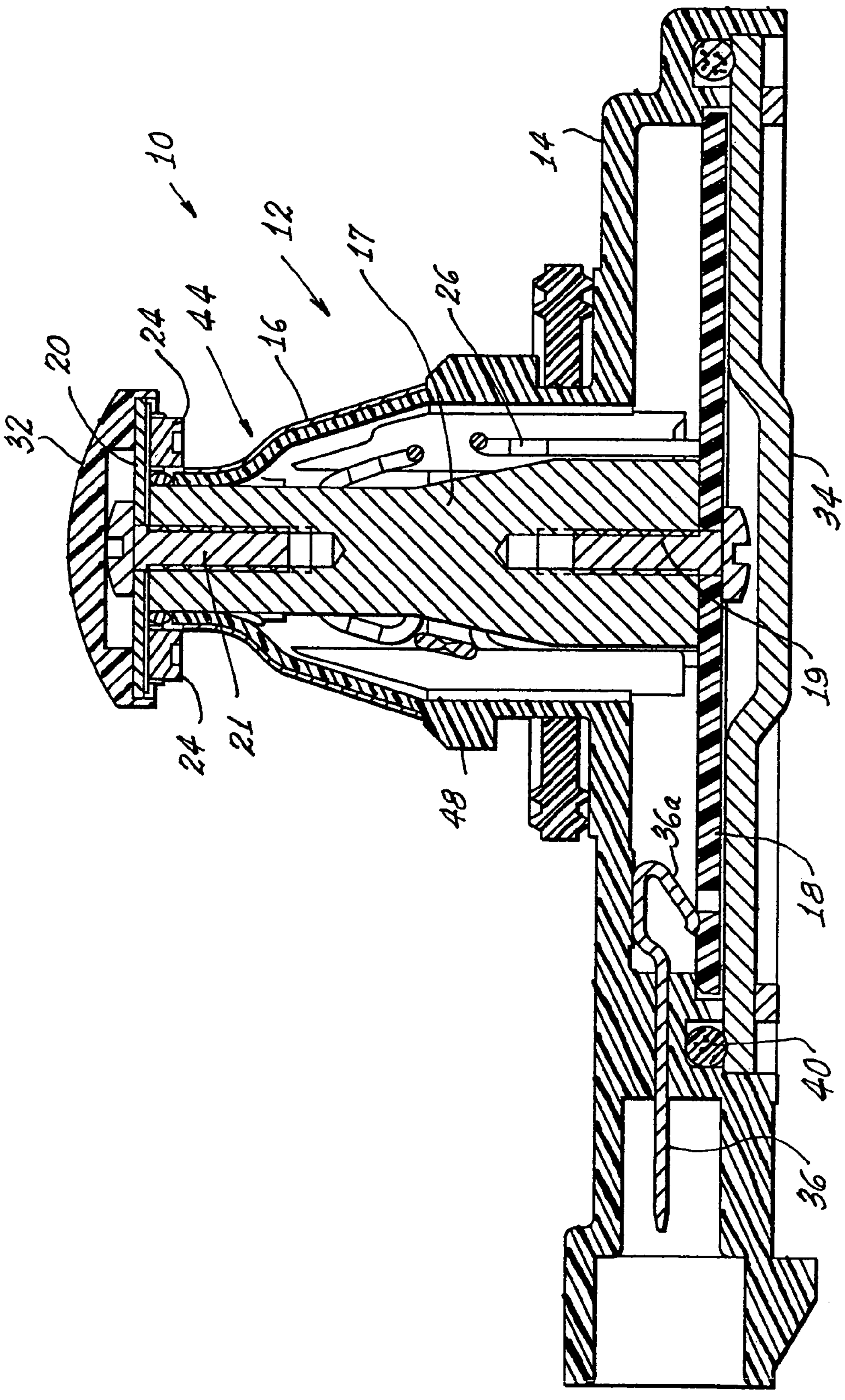
FIG. 1 is an elevational sectional view of lamp in accordance with an aspect of the invention.
Figure 2:
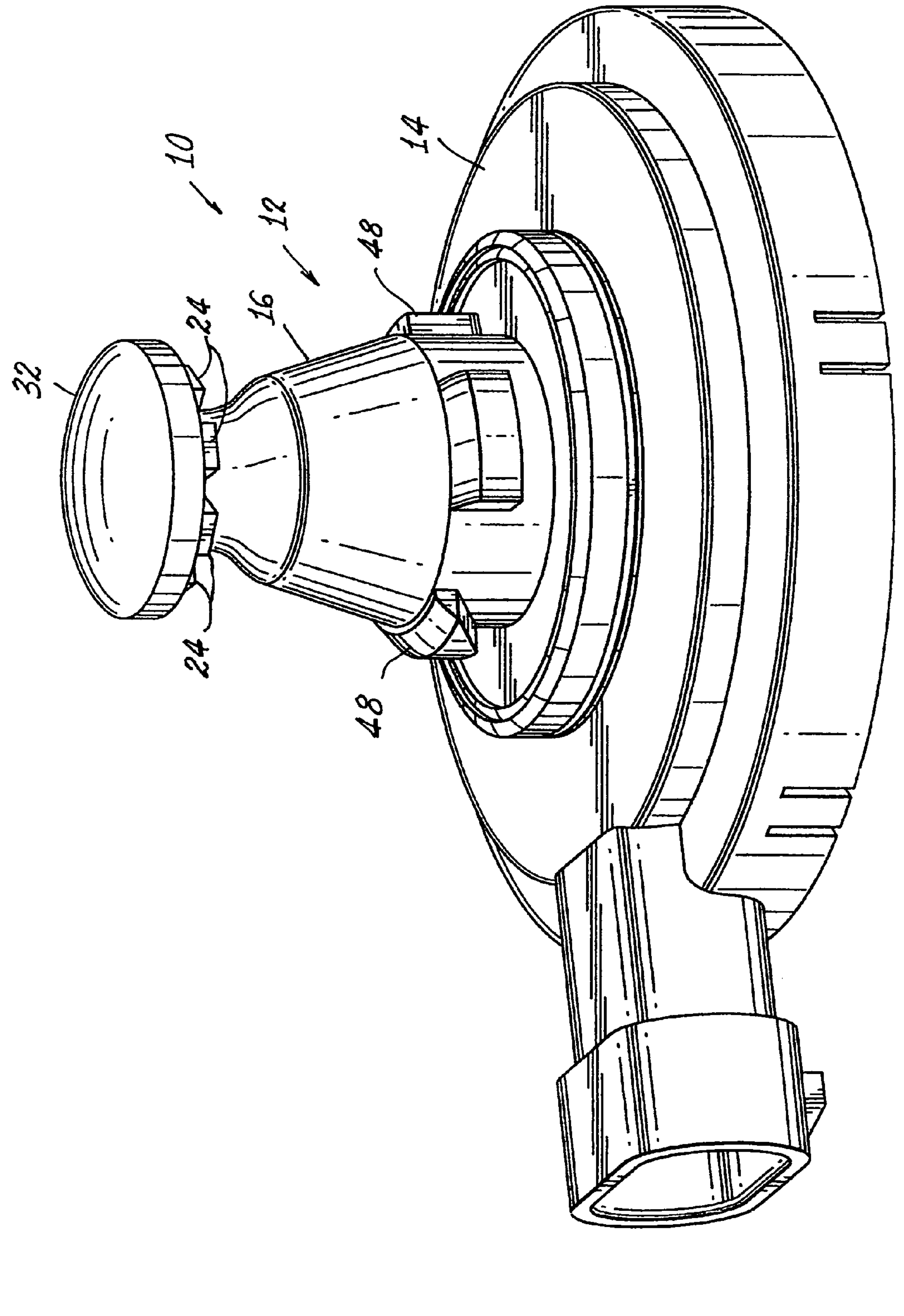
FIG. 2 is a perspective view of an embodiment of the invention.
Figure 3:
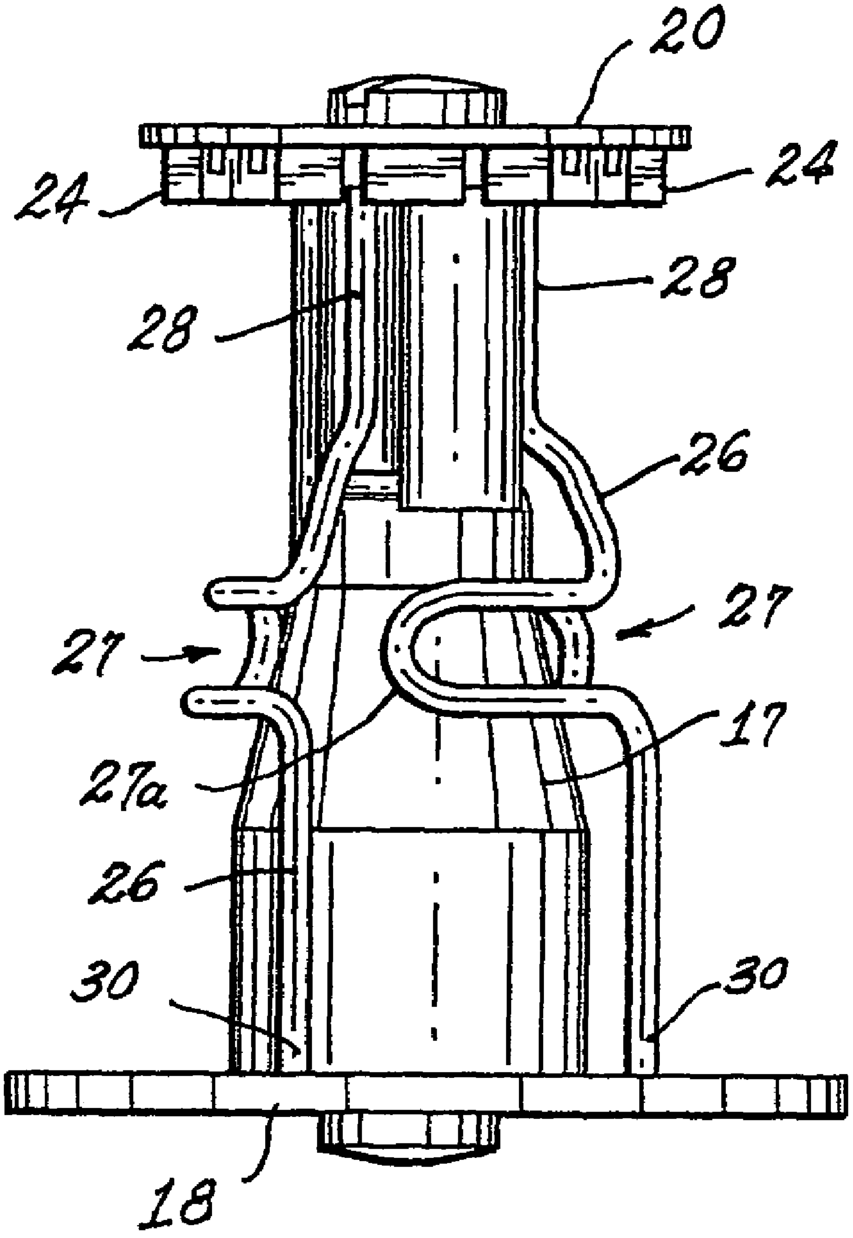
FIG. 3 is an elevational view of the central heat conductor together with the electrical conductors and one form of tension reliever.
Figure 4:
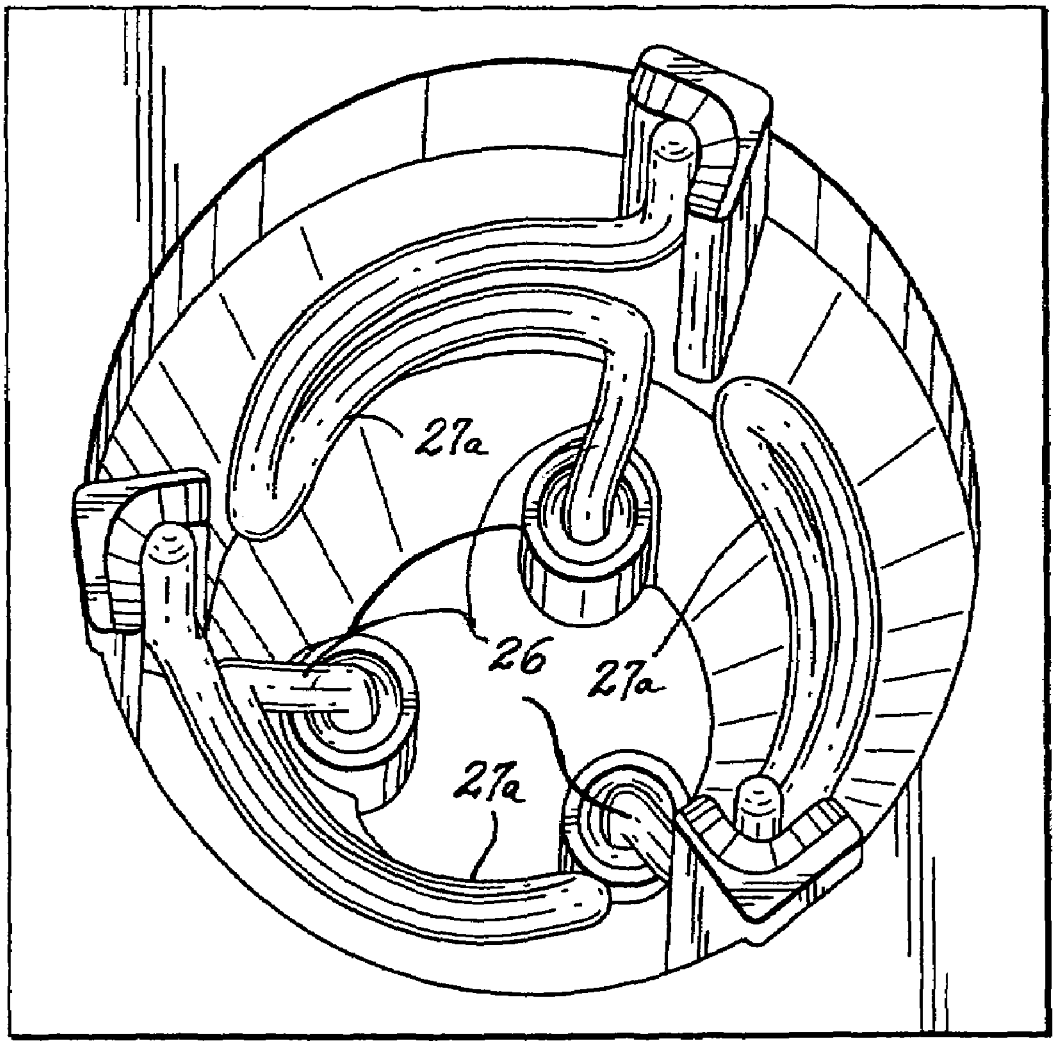
FIG. 4 is a perspective plan view illustrating the location of the electrical conductors within the hollow core.

For a better understanding of the present invention, together with other and further objects, advantages and capabilities thereof, reference is made to the following disclosure and appended claims taken in conjunction with the above-described drawings.

Referring now to the drawings with greater particularity, there is shown in FIG. 1-4 an LED light source 10 comprising a housing 12 having a base 14. A hollow core 16 projects from the base 14, the core 16 being substantially conical. A central heat conductor 17 is centrally located within the hollow core 16 and is substantially solid metal. In a preferred embodiment of the invention the metal is copper.

A first printed circuit board 18 is connected to one end of the central heat conductor, for example, by screw 19, and a second printed circuit board 20 is fitted to a second, opposite end of the central heat conductor 17. The second printed circuit board 20 has at least one LED 24 operatively fixed thereto and can also be attached to the central heat conductor by, for example, a screw 21.

The number and color emission of the LEDs will depend upon the power of each individual LED and, of course, the ultimate use. For example, if the use were for a taillight or stoplight only, the emission would be chosen to be in the red area of the spectrum; however, if the use were to be for a fog light, the emission color selected would be in the amber region of the spectrum. Also contemplated would be mixed colors, for example red and amber, where the red color would be energized in a stoplight situation and the amber would be energized when used as a turn signal. Of course, red, green and blue emitters could be blended to provide white light if that should be desired.

A plurality of electrical conductors 26 having proximal ends 28 contacting electrical traces formed on the second printed circuit board 20 and distal ends 30 contacting electrical traces on the first printed circuit board 18, is provided, and each of the electrical conductors 26 has a tension reliever 27 formed therein. In a preferred embodiment of the invention the tension reliever is formed as a loop 27*a*, which loop will compress when the circuit boards are attached, insuring good electrical contact for the conductors 26. During assembly the conductors 26 will compress axially from about 0.5 to 1.0 mm. A cap is 32 fitted over the second printed circuit board 20 and a heat sink 34 is attached to the base and in spaced from board 20, as shown in FIG. 1. Alternatively; the cap 32 and screw 21 can be formed as a single unit. Thermal contact with the first printed circuit board 18 and the base 14 is achieved by a thermal putty, such as Thermagon 304. The heat sink 34 can be attached to the base in any desired manner, so long as the heat transfer function is maintained and preferably is constructed from aluminum that has been blackened to improve radiation.

Power is supplied to the light source through at least two electrical contacts 36, which extend from inside the housing 12 to a position outside the housing 12 for connection to a power source. The internal ends 36*a* and of the electrical contacts can be provide with spring-like terminations to insure good electrical contact with the printed circuit board.

Preferably, an annular O-ring 40 is positioned between the base 14 and the heat sink 34.

The outside surface 44 of the hollow core 16 can have multiple diameters if desired or as dictated by the illumination required. Likewise, the outside surface of the hollow core 16 can be formed of deep-drawn metal or the surface can be metallized with a plating technique.

In any event, one of the diameters is provided with one or more locking flanges 48 so that the light source can be inserted into a suitable reflector.

Thus there is provided an LED light source that is particularly useful in automotive area. Adequate heat removal is provided and good electrical contact is achieved by the compression of the tension relievers formed on the contacts when the printed circuit boards are assembled to the central heat conductor. The unit is easily inserted at the time of automotive manufacture and is easily replaceable by the ultimate consumer, if that should be necessary.

While there have been disclosed what are at present considered to be the preferred embodiments of the invention, various changes and modifications can be made herein without departing from the scope of the invention as defined by the appended claims.

What is claimed is:

1. An LED light source comprising:

a housing having a base;

a hollow core projecting from said base, said core being substantially conical;

a central heat conductor centrally located within said hollow core;

a first printed circuit board connected to one end of said central heat conductor;

a second printed circuit board fitted to a second end of said central heat conductor, said second printed circuit board having at least one LED operatively fixed thereto;

a plurality of electrical conductors having proximal ends in contact with electrical traces formed on said second printed circuit board and distal ends in electrical contact with traces on said first printed circuit board, each of said electrical conductors having a tension reliever formed therein;

a cap fitted over said second printed circuit board; and a heat sink attached to said base and in thermal contact with said first printed circuit board.

2. The LED light source of claim 1 wherein at least two electrical contacts extend from inside said housing to a position outside said housing for connection to a power source.

3. The LED light source of claim 1 wherein an annular O-ring is positioned between said base and said heat sink.

4. The LED light source of claim 1 wherein the outside surface of said hollow core has multiple diameters.

5. The LED light source of claim 4 wherein one of said diameters is provided with a locking flange.

6. The LED light source of claim 1 wherein said at least one LED comprises at least two LEDs.

7. The LED light source of claim 6 wherein said at least two LEDs emit light in the same color.

8. The LED light source of claim 7 wherein said at least two LEDs emit light of different colors.

* * * * *